Figure 1:
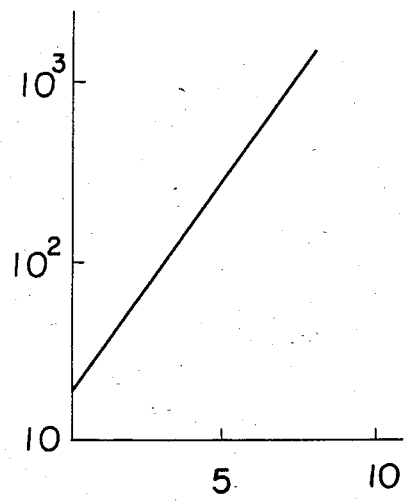

United States Patent [19]

Takakura et al.

[11] Patent Number: 4,604,303

[45] Date of Patent: Aug. 5, 1986

[54] POLYMER COMPOSITION CONTAINING AN ORGANIC METAL COMPLEX AND METHOD FOR PRODUCING A METALLIZED POLYMER FROM THE POLYMER COMPOSITION

[75] Inventors: Makoto Takakura; Susumu Kondo; Tatsuya Nogami, all of Funabashi, Japan

[73] Assignee: Nissan Chemical Industries, Ltd., Tokyo, Japan

[21] Appl. No.: 607,214

[22] Filed: May 4, 1984

[30] Foreign Application Priority Data

| May 11, 1983 | [JP] | Japan | 58-82170 |
| May 11, 1983 | [JP] | Japan | 58-82171 |
| Mar. 23, 1984 | [JP] | Japan | 59-55565 |
| Mar. 23, 1984 | [JP] | Japan | 59-55566 |
| Apr. 2, 1984 | [JP] | Japan | 59-65627 |

[51] Int. Cl.[4] .............................................. B05D 3/02
[52] U.S. Cl. ...................................... 427/229; 428/457
[58] Field of Search ......................... 427/229; 428/457

[56] References Cited

U.S. PATENT DOCUMENTS

| 3,438,805 | 4/1969 | Potrafke | 427/229 |
| 3,535,146 | 10/1970 | Flicker | 427/229 |
| 3,937,857 | 2/1976 | Brummett et al. | 427/229 |
| 3,993,807 | 11/1976 | Stabenow et al. | 427/229 |
| 4,006,047 | 2/1977 | Brummett et al. | 427/229 |

OTHER PUBLICATIONS

"How to Apply Noble Metals to Ceramics" reprinted from Jun. 1963, Ceramic Industry by R. T. Hopper.

*Primary Examiner*—Joseph L. Schofer
*Assistant Examiner*—N. Sarofim
*Attorney, Agent, or Firm*—Oblon, Fisher, Spivak, McClelland & Maier

[57] ABSTRACT

A polymer composition comprising a polymer and an organic metal complex uniformly dispersed or dissolved therein.

17 Claims, 7 Drawing Figures

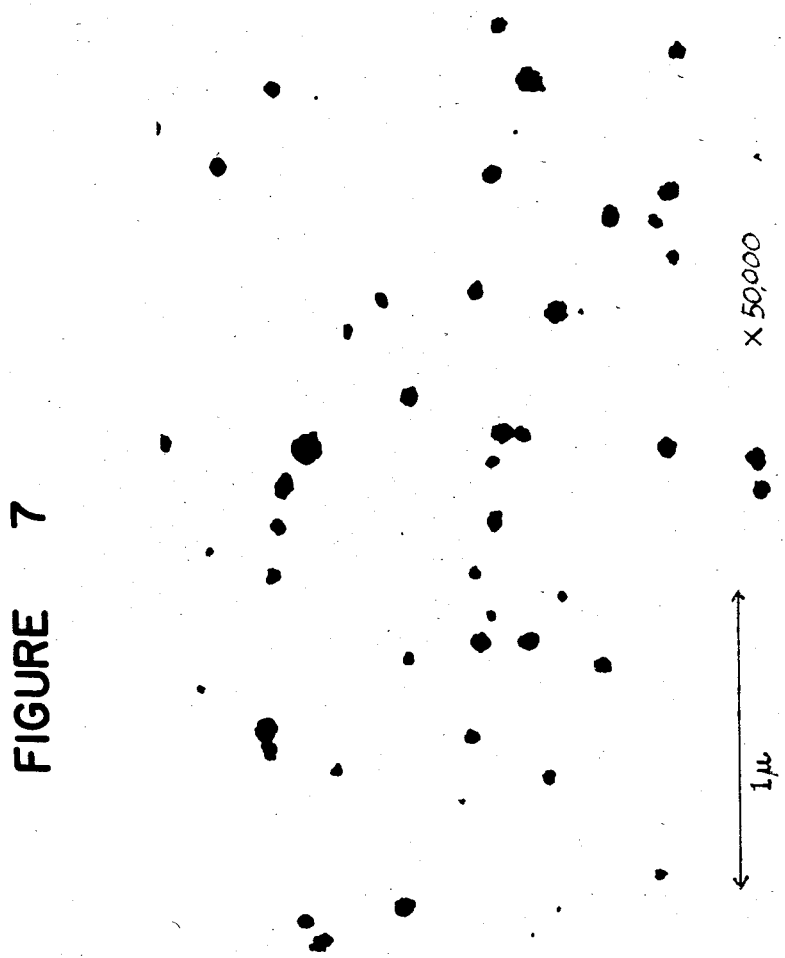

POLYMER COMPOSITION CONTAINING AN ORGANIC METAL COMPLEX AND METHOD FOR PRODUCING A METALLIZED POLYMER FROM THE POLYMER COMPOSITION

The present invention relates to a polymer composition containing an organic metal complex, and a method for producing a metallized polymer from the polymer composition.

Metallized films are commonly employed for heat panels, printed circuit boards, electromagnetic shielding plates, capacitors, acoustic diaphragms, heat-reflecting boards, antistatic boards, electrophotography etc. As a method for metallizing a polymer film surface, there has been known, for instance, lamination of a metal sheet or foil, wet metal plating, vacuum deposition, sputtering or electrically conductive paint coating.

In the method for laminating a metal sheet or foil, it is common to use an adhesive, whereby it is difficult to obtain an inexpensive product having a well balanced property such as adhesive strength between the film and the metal sheet or foil, and it is technically difficult to obtain a smooth well finished surface.

The wet plating method has disadvantages such that it involves rather complicated process steps, the metal layer-forming speed is slow, and there is a problem of how to dispose the waste treating solution. Thus, the method is costly.

The vacuum deposition method is a good metallizing method. However, the adhesive strength of the metal layer with the base film is rather weak, and surface pretreatment of the base film will be required. Besides, since a vacuum system is employed, an apparatus capable of producing a film having a wide width will be expensive, and a high level of technical skill will be required.

The sputtering method has disadvantages such that it is difficult to form a thick metal layer, and the production rate is slow.

The electrically conductive paint coating is a simple metallizing method. However, the metal layer thereby formed tends to be peeled off as time passes, and it is thereby difficult to form a thin uniform metal layer on a base film.

On the other hand, e.g. Japanese Unexamined Patent Publication No. 98879/1974 discloses a method for metallizing a polyimide film surface by treating a polyamic acid film surface with a metal complex, followed by a reaction at a high temperature to deposit the metal on the surface. However, the resin useful for this method is limited to the polyimide.

Further, a film having a metal layer pattern on its surface is widely used for printed circuit boards, connectors, heat panels or ornaments.

As a method for forming a metal layer pattern on a polymer film surface, there has been known a method wherein a metal sheet or foil is applied on one surface of a polymer film and then chemically or physically removed except for the portions of a predetermined pattern, or a method wherein a metal layer is selectively applied in a predetermined pattern onto a polymer film surface by e.g. wet metal plating, vacuum deposition or sputtering.

The method of applying a metal sheet or foil on a polymer film surface, followed by removing the metal layer except for the predetermined pattern, is widely used for the production of printed circuit boards.

Generally, the process for the production of a printed circuit board, comprises applying a copper foil onto a laminated board made of e.g. an epoxy resin or a phenol resin, or a film made of a polyimide or a polyester, then covering the necessary circuit portions with an etching resist such as a photo sensitive polymer, chemically removing the exposed copper portions with an etchant solution such as an iron chloride solution, and then removing the etching resist from the circuit portions to obtain a printed circuit board.

However, the above process has disadvantages such that the process steps are rather complicated, and since a corrosive compound is used for etching, it tends to give adverse effects to the properties of the product unless it is adequately washed away with water, and there is a problem for the treatment of the waste etching solution.

Further, it is necessary to use an adhesive for the bonding of the copper foil to the polymer base sheet, whereby there are various problems such as deterioration of the original thermal resistance or electrical characteristics of the polymer base sheet in addition to the question of adequate adhesive strength.

The method of selectively forming a metal layer in a predetermined pattern on a polymer film surface by e.g. wet metal plating, vacuum deposition or sputtering, is also employed for the preparation of printed circuit boards or ornaments.

The wet metal plating is conducted in such a manner that catalysts for metal plating are applied to the portions where a metal layer is to be formed, or the portions where no metal layer is to be formed, are covered with metal plating resist, prior to the formation of a metal layer. However, it is not easy to roughen the surface of the polymer base sheet to such an extent that adequate adhesion strength can thereby be ensured between the metal layer and the polymer base sheet. Accordingly, the polymer capable of providing adequate practical peeling strength, is rather limited.

Further, the selective application of the catalysts for wet metal plating or the precise application of the plating resist, involves technical difficulties. Besides, the process steps are rather complicated, the metal layer-forming speed is rather slow, and there is a problem of how to dispose the waste plating solution. Thus, the wet metal plating method is costly.

The vacuum deposition and sputtering are excellent as a method for forming a metal layer. However, in order to form a metal layer only at a predetermined portion, other portions must be covered. A vacuum system or an inert atmosphere is employed, and accordingly a difficult high technique will be required for a continuous process and the apparatus will be expensive.

Conventional pressure-sensitively conductive rubber-like polymer films are usually prepared by blending and dispersing into a rubber-like base material, a conductive powder as a conductive material, for instance, a carbon powder such as carbon black or graphite powder, or a metal powder such as gold, silver, nickel, stainless steel or copper stabilized with a noble metal.

It is common that the conductive powder is mechanically dispersed into the rubber-like polymer by means of e.g. a ball mill, a roll mill, a Bumbury mixer or a screw extruder. However, the degree of dispersion is largely dependent on the dispersing method and the dispersing conditions. Accordingly, it has been difficult to obtain pressure-sensitively conductive rubber-like polymer films which are capable of providing predetermined characteristics consistently. Further, the selection of the conductive powder is also important. Even when the same kind of the conductive powder is used, the pressure-sensitive conductivity or the durability for repeated use, varies to a large extent depending upon the shape, particle size or particle size distribution of the conductive powder.

With the conventional pressure-sensitively conductive rubber-like polymer film, it is intended to utilize the change of electric resistance caused by a strain exerted to the film. However, it use to be difficult to optionally control the electric resistance to change in proportion to the strain. Nevertheless, the pressure-sensitively conductive rubber-like polymer film is preferably used for various switches, such as switches for automatic doors, mat switches of electro-motive sewing machines, etc. in view of the merits that it contains no mechanical driving parts and thus is free from an electric noise, and it is thereby possible to substantially reduce the size and the weight. Accordingly, such a pressure-sensitively conductive film is expected to find a wider range of applications.

On the other hand, a metal-containing polymer is usually intended for the utilization of the nature of the metal i.e. the characteristics of the metal against e.g. electricity, magnetism, heat, light, sound, chemical or radiation. Particularly, a polymer in which fine metal particles are uniformly dispersed, is of great interest. As a method for producing a polymer containing a metal, it is known to mix a polymer with metal powder. However, there is a limitation to the size of the metal particles which can be mixed and dispersed with the polymer. For instance, it is practically difficult to uniformly disperse metal particles having a size of not greater than 10 m, in a polymer, and a shaped article thereby obtained tends to be inferior in its mechanical strength.

There are several methods for dispersing into a polymer, metal particles obtained by means of a mechanical grinding method, a cutting method, a jet grinding method, an electrolytic method or a melt atomizing method. For instance, a method of mechanically dispersing metal particles into a polymer molten under heating in a roll mixer, a Banbury mixer or a continuous screw extruder, or a method of dispersing metal particles in a solution of the polymer in a suitable solvent, may be mentioned as an industrially useful method.

However, when metal particles are to be dispersed into the polymer in a high concentration according to these methods, the metal particles are likely to contact one another, and accordingly the amount of the metal particles to be incorporated is limited to a certain level.

Further, Japanese Unexamined Patent Publication No. 63594/1978 proposes a process for precipitating a metal in a resin by using the pyrolytic characteristics of metal hydrides. However, the metal hydrides have a low pyrolytic temperature and are susceptible to moisture. Thus, the process is not practical.

Under these circumstances, the present inventors have conducted extensive researches, and have found that an organic metal complex can readily be dispersed or dissolved in a polymer and the polymer composition containing such an organic metal complex can readily be metallized by heat treatment. The present invention is based on these discoveries.

Namely, the present invention provides a polymer composition comprising a polymer and an organic metal complex uniformly dispersed or dissolved therein.

The present invention also provides a method for producing a metallized polymer, which comprises heat-treating the above-mentioned polymer composition. Here, the term "metallized polymer" includes a polymer film with a metallized surface, a polymer film having a metal layer of a predetermined pattern on its surface, a polymer with fine metal particles uniformly dispersed therein and a pressure-sensitively conductive rubber-like polymer film with a metallized surface.

Now, the present invention will be described in detail with reference to the preferred embodiments.

In the accompanying drawings, FIGS. 1 to 6 are graphs showing the relationship between the stretching rate extent of elongation and the electric resistance with respect to the metallized films obtained by Examples 25 to 30, respectively.

FIG. 7 is a transmission-type electron microscopic photograph of palladium metal particles obtained in Example 33 (50,000 magnifications).

The organic metal complex to be used in the present invention, is selected from those which are soluble in an organic solvent and capable of freeing the metal when heated. Such organic metal complexes may be represented by the general formula $M_mL_n$ where m is an integer of from 1 to 4, n is an integer of from 2 to 12, M is a metal and L is a ligand. Metal M may be at least one metal selected from the group consisting of metals of Groups IV-A, V-A, VI-A, VII-A, VIII and I-B of the Periodic Law Table. The ligand L may be at least one ligand selected from the group consisting of a tertiary phosphine, a tertiary phosphite, carbon monoxide, an aliphatic or alicyclic olefin, a conjugated olefin, an aryl compound, a heterocyclic compound, an organic cyano compound, an organic isonitrile compound, an organic mercapto compound, a compound having an alkyl group, a vinyl group, an allyl group, an ethynyl group or an acyl group, halogen, oxygen, hydrogen and nitrogen. From the viewpoint of the heat treatment of the organic metal complex, the boiling point of the ligand is preferably not higher than 400° C. As specific examples, there may be mentioned a ligand selected from the group consisting of triphenylphosphine, tributylphosphine, triethylphosphine, triphenylphosphite, tributylphosphite, triethylphosphite, carbon monoxide, cyclooctadiene, a substituted or unsubstituted cyclopentadiene, cyclooctatetraene, butadiene, pentadiene, a substituted or unsubstituted benzene, acetonitrile, benzonitrile, a compound having a lower alkyl group or a benzyl group, ethylene, propylene, isobutylene, t-butyl-isonitrile, vinyl-isonitrile, benzo-isonitrile, a substituted or unsubstituted acetylene, acetylacetone, ethyl acetyl acetonate, pyridine, thiophene, quinoline, furan, 2,2'-dipyridyl, ethylenedithiol, toluene-3,4-dithiol, chlorine and bromine.

As the central metal of the organic metal complex to be used in the present invention, titanium, zirconium, vanadium, chromium, molybdenum, tungsten, manganese, rhenium, iron, cobalt, nickel, ruthernium, iridium, rhodium, palladium, osmium, platinum, copper, silver and gold, are preferred. The organic metal complex containing such metals, is preferably stable against oxygen or moisture. However, the present invention can be practiced irrespective of the stability of the organic metal complex against oxygen or moisture so long as the preparation of the polymer composition containing such an organic metal complex, and the casting or coating of the composition and drying the solvent therefrom, are conducted in an inert atmosphere, for example, in a dried nitrogen stream.

The heat treatment may be conducted in the atmospheric air or in an inert gas atmosphere. However, it is usual to conduct the heat treatment in the atmospheric air.

As the polymer to be used in the present invention, there may be mentioned, for instance, an ionomer resin, an acrylonitrile-acrylic-styrene resin, an acrylonitrile-styrene resin, an acrylonitrile-butadiene-styrene resin, a methylmethacrylate-butadiene-styrene resin, a phenoxy resin, an ethylene-vinylchloride copolymer, an ethylene-vinylacetate copolymer, a polystyrene, a polyvinylidene chloride, a vinyl acetate, a polyethylene, a polypropylene, a polybutadiene, a polyvinylidene fluoride, a polytetrafluoroethylene, a polyacetal, a polyamide, a polyamide-imide, a polyarylate, a polyetherimide, a polyether-ether ketone, a polyethyleneterephthalate, a polybutyleneterephthalate, a polycarbonate, a polysulphone, a polyethersulphone, a polyphenylene oxide, a polyphenylene sulfide, a polymethylmethacrylate, a guanamine resin, a diallylphthalate resin, a vinyl ester resin, a phenol resin, an unsaturated polyester resin, a furan resin, a polyimide resin, a poly-p-hydroxybenzoate, a urethane resin, a melamine-formaldehyde resin, a urea-formaldehyde resin, an epoxy resin and a xylene-formaldehyde resin.

These polymers may be used alone or in combination as a mixture. Further, these polymers may be used in the form of a powder, granules or a mass, or may be used in the form of a dispersion or a solution of a polymer in a proper solvent.

The polymers to be used for the preparation of a film having a metallized surface or a film having a metal layer pattern on its surface, are required to be soluble in an organic solvent. Whereas, the polymers to be used for the preparation of a polymer with fine metal particles dispersed therein, such as a dielectric polymer composition, are not so restricted. The polymers to be used for the high dielectric polymer composition, are preferably selected from polymers exhibiting a high antibreakdown voltage and a low dielectric loss tangent.

There is no particular restriction to the rubber-like polymer useful for the present invention. As specific examples, there may be mentioned, for instance, a styrene-butadiene rubber, a polybutadiene rubber, a polyisoprene rubber, an acrylonitrile-butadiene rubber, a polychloroprene rubber, a butyl rubber, a urethane rubber, an acrylate rubber, a silicone rubber, a fluorinated rubber, a styrene-block copolymer, a thermoplastic elastomer polyolefin, a thermoplastic elastomer polyvinylchloride, a thermoplastic elastomer polyurethane, a thermoplastic elastomer polyester, a thermopolastic elastomer polyamide, a thermoplastic elastomer fluorinated resin and a natural rubber.

With a view to permitting uniform dispersion of the organic metal complex, the rubber-like polymer is preferably the one which is soluble in a solvent in an unvulcanized state. Particularly preferred is a rubber-like polymer which is durable for repeated deformations and which has excellent heat resistance.

There is no particular restriction to the solvent for the polymer or the solvent for the metal complex. The solvents may be used alone or in combination as a mixture of solvents. For instance, there may be mentioned chloroform, methylenechloride, trichloroethylene, tetrachloroethylene, benzene, toluene, xylene, acetone, ethylacetate, dimethylformamide and dimethylsulfoxide. These solvents are used for the preparation of a polymer composition wherein an organic metal complex is uniformly dispersed or for the control of the viscosity of such a composition to provide it with proper processability.

The method for the production of a metallized polymer according to the present invention, comprises heat-treating the polymer composition comprising a polymer and an organic metal complex. The heat treatment is conducted at a temperature sufficient to let the organic metal complex free the metal. Therefore, the temperature may not necessarily be as high as the decomposition temperature of the organic metal complex. Namely, the temperature for the heat treatment is usually selected within a range of from 50° to 400° C., preferably from 100° to 350° C. so that the polymer does not undergo thermal deterioration. The heating time may optionally be selected depending upon the particular purpose. It is usually from a few minutes to several tens minutes.

The polymer composition to be heat-treated comprises a polymer and an organic metal complex usually in a weight ratio of the polymer to the metal of the complex within a range of from 99.99:0.01 to 1:99.

In the case of metallized films, films with metal layer patterns and pressure sensitive conductive films of the present invention, a mixture of a polymer and an organic metal complex in a weight ratio of the polymer to the metal of the organic metal complex of from 99.99:0.01 to 50:50, preferably from 99.9:0.1 to 80:20, is dissolved or dispersed in an optional organic solvent to obtain a solution of the polymer composition comprising the organic metal complex. In the case of metallized films and films with metal layer patterns, the polymer concentration in the solution is usually from 1 to 50% by weight, preferably from 5 to 30% by weight.

In the case of the highly dielectric polymer with fine metal particles uniformly dispersed therein, the metal content is preferably from 2 to 70% by volume, more preferably from 5 to 50% by volume. If the metal content is less than 2% by volume, the permittivity will be too small, and if it exceeds 70% by volume, the moldability will be poor.

The polymer composition of the present invention is obtainable by preparing a uniform solution or a uniform dispersion of the polymer and the organic metal complex in a solvent, and removing the solvent therefrom. The polymer composition containing the organic metal complex uniformly distributed, may be obtained by thoroughly mixing the solution. For instance, a uniform composition comprising a polymer and an organic metal complex may readily be prepared by a method wherein a polymer and an organic metal complex solution are mixed by means of a mixer, followed by removing the solvent, or by a method wherein a polymer solution and an organic metal complex solution are uniformly mixed, followed by the removal of the solvent.

The solution of the polymer composition containing the organic metal complex may be cast on a casting board to form a film, or may be coated on a substrate to form a coating film. The polymer composition containing the organic metal complex, thus prepared, is then treated in various manners depending upon the particular purpose.

According to a first embodiment of the present invention, a polymer film with a metallized surface will be obtained by heat-treating a film made of the above-mentioned polymer composition. More specifically, a solution of the polymer composition containing the organic metal complex is cast on a casting board or coated on a substrate, and the film thereby formed is then subjected to heat treatment with a metallizing board(specific board for metallization) intimately placed on its surface, whereby the surface which is in contact with the metallizing board will selectively be metallized to form a metallized film having superior adhesive strength with the base polymer. The solution of the polymer composition may be applied directly onto the metallizing board to form a film thereon, which is then subjected to the heat treatment.

The metallizing board to be used in this embodiment is important for the formation of a metal layer on the polymer film. Namely, even if the film formed by the casting of the solution of the polymer composition containing the organic metal complex, is subjected to heat treatment without being brought in contact with the metallizing board, the film surface will not be metallized. On the other hand, it is also impossible to obtain a metallized film even if the film is subjected to heat treatment under such condition that it is intimately in contact with a resin substrate made of e.g. polyethyleneterephthalate, polyacrylate, polycarbonate, polytetrafluoroethylene, silicone rubber, polyethylene or polypropylene or a substrate made of copper, copper alloy, aluminum or glass coated on its surface with such a resin.

Accordingly, in order to selectively metallize the film surface, it is necessary that the polymer film containing the organic metal complex is intimately in contact with the metallizing board during the heat treatment.

More specifically, the casting method includes a method of metallizing the front surface of the film, a method of metallizing the back surface of the film and a method of metallizing both surfaces of the film. For the metallization of the film, the metallizing board is brought in contact with the film surface on which the metal layer is to be formed, followed by the heat treatment. The metallizing board is required to be made of a material which has adequate heat resistance at the temperature of the heat treatment and which can be readily released from the metallized film. For example, there may be mentioned copper, a copper alloy, aluminum, glass and a resin such as polyethyleneterephthalate pretreated to have a thin layer of an organic metal complex solution on its surface.

On the other hand, the casting board may be made of any material so long as it is durable against the solution of the polymer composition containing the organic metal complex and is readily releasable from the film. For example, there may be mentioned steel, chrome-plated steel, polyester, polytetrachloroethylene, silicone rubber, polyethylene and polypropylene. In the case where it is desired to metallize the side of the film which is in contact with the casting board, a metallizing board may be used as the casting board, and the material for the metallizing board is as specified above.

The substrate for coating may be made of any material so long as it exhibits good adhesion to the polymer composition containing the organic metal complex. The combination of the coating substrate with the polymer composition is limited by the compatibility in this respect.

When the solution of the polymer composition containing the organic metal complex is cast on the metallizing board, followed by the heat treatment, it is possible to obtain a film metallized only on its lower surface. Further, when the above-mentioned steel or chrome-plated steel is used as the casting board and the metallizing board is brought in contact with the upper surface of the film during the heat treatment, it is possible to obtain a film metallized only on its upper surface.

It is possible to metallize both surfaces of the film by subjecting it to heat treatment by placing the metallizing board on each surface. In this case, the metallizing board may be used as the casting board, so that the film formed on the board can be subjected to the heat treatment as it is. Otherwise, the formed film may be peeled off from the casting board, and then subjected to the heat treatment by bringing it in contact with a metallizing board.

In the case of the coating method, it is possible to metallize the surface of the coating film in the same manner as the metallization of the upper surface of the film formed by the casting method, after coating the solution of the polymer composition containing the organic metal complex on the coating substrate.

Thus, it is possible to optionally select the kind of the organic metal complex, the metal content in the complex and the concentration of the polymer composition containing the organic metal complex depending upon the particular applications e.g. as a heat-reflecting boards, a heat panel, a printed circuit board or a capacitor having a semispecular metal surface.

Further, it is also possible to metallize and make electroconductive both surfaces of the polymer film containing the organic metal complex by sandwiching the polymer film with a pair of metallizing boards made of glass, copper, aluminum or resin during the heat treatment.

With respect to the metallized film thus obtained, the formed metal can be identified and the formed state of the metal can be investigated by an X-ray diffractometer, an X-ray spectroscopy or a scanning electron microscope. The metal formed by the heat treatment of the organic metal complex is localized in its substantial entirety on the surface of the film which is in contact with the metallizing board and the metal is integral with the polymer and thus has strong adhesion strength.

In a second embodiment of the present invention, a polymer film having a metal layer of a predetermined pattern on its surface, is obtained by heat-treating the polymer composition in the same manner as described above, except that a pattern-forming board is used in place of the metallizing board. Namely, the polymer film is subjected to heat treatment under such condition that it is brought in contact with the pattern-forming board. As such a pattern-forming board, there may be mentioned a board made of a material capable of inducing the metallization as mentioned above and partially coated with a resin which does not induce the metallization, for instance, a board made of copper, a copper alloy, aluminum or glass, on which a film of e.g. a polyester, polytetrafluoroethylene or polypropylene cut into a predetermined pattern, is intimately bonded, or a board capable of inducing the metallization, which is coated with an organic paint or a polymer solution such as an epoxy resin or a silicone resin by means of e.g. screen printing except for the portions corresponding to the predetermined pattern.

However, the pattern-forming board is not restricted to such boards. For instance, there may be employed a resin board made of e.g. polyethyleneterephthalate, on which an organic metal complex solution has been applied in the predetermined pattern by means of e.g. screen printing, or a resin board made of a resin which does not induce the metallization, such as polyethyleneterephthalate, an epoxy resin or a phenol resin, on which a material capable of inducing the metallization, such as copper, a copper alloy, aluminum or glass, is formed in the predetermined pattern, for instance, a copper printed epoxy resin or phenol resin board, or a flexible printed polyimide or polyethyleneterephthalate board.

A solution of the polymer composition containing the organic metal complex is cast on a casting board made of e.g. polyethyleneterephthalate, polyethylene, polypropylene or polytetrafluoroethylene which does not induce the metallization and which is durable against the solvent used for the preparation of the polymer composition, and adjusted to a predetermined film thickness by means of e.g. a doctor knife. After removing the solvent by heating at a temperature which does not brings about the thermal decomposition of the organic metal complex, the formed film is peeled off from the casting board, whereby a polymer film containing the organic metal complex is obtained.

The polymer film is brought in contact with the above-mentioned specific pattern-forming board and subjected to heat treatment, whereby a film having a metal layer of a predetermined pattern formed only on the surface which is contact with the pattern-forming board, is obtained.

It is also possible to form the metal layer patterns on both sides of the polymer film by subjecting the polymer film to the heat treatment under such condition that the both surfaces of the polymer film are in contact with the pattern-forming boards. Further, it is also possible to cast the solution of the polymer composition containing the organic metal complex directly on the pattern-forming boards and subject it to the heat treatment after removal of the solvent, whereby a film having a metal layer pattern formed only on the surface which is in contact with the pattern-forming board, is obtained.

Further, it is possible to form a metal layer pattern on a coating film surface by coating the polymer composition on a shaped resin article made of a resin which does not induce the metallization and which is durable against the solvent used for the preparation of the polymer composition containing the organic metal complex and has good adhesion to the polymer composition, such as polyethyleneterephthalate, an epoxy resin or a phenol resin, then drying the coated polymer composition, and heat-treating it with the pattern-forming board placed thereon.

According to a third embodiment of the present invention, a pressure-sensitively conductive rubber-like polymer film is obtained by heat-treating a polymer composition comprising a rubber-like polymer containing an organic metal complex. Namely, an unvulcanized rubber-like polymer solution containing an organic metal complex is cast on a prescribed metallizing board, and after the removal of the solvent, subjected to heat treatment, whereby only the surface which is in contact with the metallizing board, will be metallized. Alternatively, the unvulcanized rubber-like polymer solution containing the organic metal complex is cast on a prescribed casting board, and after the removal of the solvent, subjected to heat treatment with a metallizing board placed intimately on the formed film, whereby only the surface which is in contact with the metallizing board will be metallized. Thus, a pressure-sensitively conductive rubber-like polymer film having a metallized surface will be obtained.

Namely, as mentioned earlier with respect to the metallized polymer film, even if the unvulcanized rubber-like polymer solution containing the organic metal complex is cast, and after the removal of solvent, the formed rubber-like polymer film is subjected to heat treatment without contacting it with a metallizing board, no metallization takes place on the rubber-like polymer film surface.

In order to selectively metallize the rubber-like polymer film surface, it is necessary that the rubber-like polymer film containing the organic metal complex is intimately in contact with the metallizing board during the heat treatment. As the metallizing board, the same metallizing board as used for the preparation of the above-mentioned metallized polymer film, may be employed so long as it has adequate heat resistance at the temperature of the heat treatment and it can readily be peeled from the metallized rubber-like polymer film.

As the casting board, the same casting board as used for the preparation of the polymer film having a metallized surface or the film having a metal layer of a predetermined pattern, may be employed. There is no particular restriction to the casting board so long as it is durable against the solvent used, and can readily be peeled from the rubber-like polymer film.

In the case of using the casting board, after the removal of the solvent, the rubber-like polymer film is vulcanized at a temperature lower than the temperature at which the organic metal complex liberates the metal, to such an extent that it presents adequate releasing nature from the casting board, or to the complete vulcanization. Then, the rubber-like polymer film is peeled off from the casting board, and it is brought in close contact with the metallizing board and subjected to heat treatment, whereby a pressure-sensitively conductive rubber-like polymer film metallized on the surface contacting the metallizing board, will be obtained. If the heat treatment is conducted under such condition that both surfaces of the film are in contact with the metallizing boards, a rubber-like polymer film metallized on both surfaces, will be obtained.

The unvulcanized rubber-like polymer solution containing the organic metal complex, is molded by casting and then subjected to heat treatment. This heat treatment is conducted at a temperature which is sufficiently high to let the organic metal complex free the metal under the heating. Further, it is possible to complete the vulcanization of rubber at a temperature at which no adequate reaction of the organic metal complex to free the metal by the heating will proceed, and then conduct the metallization treatment at a temperature sufficient for the reaction.

The reason why the metallized rubber-like polymer film of the present invention exhibits a pressure-sensitive electric conductivity, may be explained as follows.

From the observation of the metallized layer on the surface by means of a scanning-type electron microscope, it has been found that the metallized layer is composed of a highly densed aggregation of very fine metal particles and usually constitutes a layer having a thickness of from 1 to 20 $\mu$m depending upon the production conditions. The metallized layer is integral with the rubber-like polymer and firmly bonded to the rubber-like polymer. In this state, the metal layer on the surface conducts electricity and exhibits a certain conductivity.

When a strain is exerted to the metallized rubber-like polymer film, the metal layer on the surface deforms along with the deformation of the rubber-like polymer film, and accordingly, the state of contact of the fine metal particles changes, whereby the conductivity decreases depending upon the degree of the deformation of the metal layer on the surface.

The change of the state of contact of the fine metal particles resulting from the deformation of the rubber-like polymer film, is very well reproducible and highly dependent on the deformation, and thus is excellently interrelated with the change of the conductivity or the electric resistance.

When the strain is released to permit the rubber-like polymer film to return to the initial state, the state of contact of the fine metal particles likewise returns to the initial state and thus presents the same level of electric conductivity as was prior to the deformation.

The degree of the deformation of the pressure-sensitively conductive rubber-like polymer film varies depending upon the conditions for the production of the film, such as the type of the organic metal complex, the metal content, the type of the rubber-like polymer, the thickness of the rubber-like polymer film containing the organic metal complex or the conditions of the heat treatment. However, the film has extremely good reproducibility for repeated use usually at a stretching rate upto 50%, preferably upto 20%. Within this range, the state of aggregation of the fine metal particles changes in proportion to the degree of the deformation of the rubber-like polymer film, whereby the state of contact of the particles changes correspondingly, and no breakage of the state of aggregation of the fine metal particles takes place. Therefore, there will be no practical problem in the durability for repeated use within this range.

As opposed to the conventional pressure-sensitively conductive rubber-like polymer film wherein conductive particles are dispersed in a rubber-like polymer, the pressure-sensitively conductive rubber-like polymer film of the present invention is a conductor at the normal state, and its elecric resistance increases as it deforms and finally reaches to an insulated state, and upon release from the deformation, it returns to the initial conductor.

Further, the metal layer on the surface of the pressure-sensitively conductive rubber-like polymer film of the present invention, may be coated with e.g. a rubber-like polymer for the purpose of improving the durability under various environments. In such a case, there will be no change in the intrinsic properties of the pressure-sensitively conductive rubber-like polymer film.

Even if it is attempted to form a metal layer on a rubber-like polymer film by a conventional method such as vacuum deposition, sputtering, ion plating or wet metal plating with an intention to obtain the same effects as in the present invention, the adhesive strength of the metal will be quite weak and it will be difficult to form a stabilized metal layer. Even if a metal layer can be formed by some method, the metal layer will be likely to fall off from the surface when the rubber-like polymer film deforms, and it is unlikely to provide such a superior function as is obtainable by the present invention, and it will be practically useless.

The degree of the metallization of the surface of the polymer film containing the organic metal complex, may be optionally adjusted by properly selecting various conditions such as the metal content in the organic metal complex, the amount of the complex to be incorporated in the polymer, the type of the metallizing board or the casting board, the material of the pattern-forming portion of the pattern-forming board and the heating condition.

According to a fourth embodiment, a polymer containing finely dispersed metal particles, may be obtained by heating the above-mentioned polymer composition containing the organic metal complex. Namely, according to this embodiment, the pyrolytic reaction of the organic metal complex is utilized to form fine metal particles in the polymer.

Organic metal complexes have been studied mainly in the field of chemistry of catalysts, and in recent years, they have been studied for their applications to such fields as synthetic organic chemistry and biological chemistry. However, no substantial study has been made on the use of the organic metal complexes for the purpose of uniformly dispersing metal particles in polymers. The present inventors have studied various organic metal complexes for their pyrolytic properties and their thermal decomposition products. As a result, it has been found that the complexes which are capable of releasing metals when heated, are extremely effective for the purpose of obtaining polymer compositions containing finely dispersed metals.

It has been known that when a polymer composition containing metal particles dispersed therein is placed under an electric field, interfacial polarization appears at the interface between the metal particles and the polymer, and thus such a composition gives high permittivity.

The intensity of the interfacial polarization varies depending on e.g. the eccentricity of metal particles when the metal particles are assumed to be an ellipsoid of revolution, the conductivity or surface area of the metal particles, or the volume ratio of the metal particles in the polymer.

Accordingly, it should be possible to obtain a metal particle-dispersed polymer composition having a high permittivity, by dispersing fine metal particles having great eccentricity (i.e. being elongate in the direction of the electric field) and high conductivity in a high concentration.

However, when it is attempted to disperse metal particles in a high concentration by conventional processes, the metal particles tend to contact one another and they are hardly uniformly dispersed. Thus, the amount of metal particles to be incorporated is limited.

If the dispersion of the metal particles is poor, it is likely that the particles contact one another locally, and the dielectric breakdown voltage of the polymer composition containing the metal particles will be so low that it is no longer practically useful.

Thus, it has been theoretically known that if fine metal particles can be incorporated in a high concentration into a polymer, it is possible to obtain a useful dielectric. However, there has been no practical means to accomplish it because of the difficulties in obtaining a uniform dispersion of fine metal particles in a polymer.

Under these circumstances, it is extremely significant that the present invention provides an efficient method for the production of a polymer composition wherein fine metal particles are uniformly dispersed. The metal particles dispersed in the polymer according to the present invention are very fine and have an average particle size of from 20 to 200 m$\mu$ although the particle size varies depending upon the type of the metal, the type of the polymer or the conditions for the heat treatment. Further, the metal particles formed, are present independently from one another in the polymer. Thus, the polymer composition of the present invention containing uniformly dispersed fine metal particles exhibits superior dielectric characteristics and high permittivity when placed in an electric field.

According to the present invention, a polymer in an optional form is mixed with a solution of an organic metal complex in a solvent to form a polymer composition containing the organic metal complex, whereby the two components are much more uniformly mixed as compared with the case where no solution of the organic metal complex is used. Accordingly, it is thereby possible to obtain a polymer containing fine metal particles uniformly dispersed. The mixing is preferably conducted at a temperature at which no substantial pyrolysis of the organic metal complex proceeds. Further, other additives, such as another stabilizer, a plasticizer or a colorant, may optionally be incorporated as the case requires. The polymer containing the finely dispersed metal particles may be molded into an optional shape depending upon the particular use. The molding may be conducted simultaneously at the time of the above heating, or may be conducted prior to or after the heating, as the case requires. For instance, in order to obtain a molded product of the polymer containing finely dispersed metal particles, a usual molding method such as compression molding, injection molding or extrusion molding may be conducted at the same time as or subsequent to the heating, or a coating method or casting method may be employed, whereby a molded product such as a film, a sheet or a coating film is obtainable.

With respect to the polymer composition containing metal particles and having an optional shape, the liberated and precipitated metal and the state of dispersion may be investigated by means of e.g. an X-ray diffraction meter, an X-ray microanalyzer or a scanning type electron microscope.

The size of the metal particles liberated and precipitated in the polymer by a pyrolytic reaction of the organic metal complex, is extremely fine at a level smaller than 1 $\mu$m. Such a small size can not be identified even by the observation by means of a scanning type electron microscope under magnifications.

The polymer composition containing finely dispersed metal particles obtained by the present invention, may be used for various applications, such as a high capacity capacitor, a photo-detecting element, a heat releasing panel, a radiation insulator, a magnetic tape or a magnet, in addition to the use as a highly dielectric composition which will be described hereinafter.

The features of the dielectric composition of the present invention comprising a polymer and fine metal particles dispersed therein, reside in the high permittivity, the high dielectric breakdown voltage and the excellent moldability.

According to the method of the present invention, the metal particle content in the polymer can be increased to any desired level without bringing the particles to contact one another, whereby particles are uniformly dispersed and the dielectric breakdown voltage of the polymer composition will not decrease. Because, according to the method of the present invention, a solvent-soluble organic metal complex and a polymer are mixed, and heated to a temperature sufficient for the thermal decomposition of the organic metal complex in the presence of the solvent or after the removal of the solvent, whereby the organic metal complex will be decomposed to precipitate the metal. Namely, in the method of the present invention, the metal will precipitate from the inside of the polymer, and the surrounding polymer will serve as a partition between the metal particles, whereby metal particles are prevented from contacting one another.

The dielectric composition of the present invention may be formed into various shapes, for instance into a film, a sheet, a chip or a rod, depending upon the particular purpose. The processability for this purpose is also practically very important as well as the permittivity. In the polymer composition of the present invention, the metal particles are very finely dispersed in the polymer, the processability will not be impaired even when the metal particles are formed in the composition in a high concentration. Any industrial molding machine such as a compression molding machine, an injection molding machine, an extrusion molding machine or a roller molding machine, may be employed.

Now, the present invention will be described in further detail with reference to Examples. However, it should be understood that the present invention is by no means restricted by these specific Examples.

METALLIZED FILMS

EXAMPLE 1

In 66.4 g of chloroform, 2.31 g of di-$\mu$-chloro-bis ($\eta$-2-methylallyl)dipalladium (II) as an organic metal complex and 5.00 g of a polysulphone (Udel Polysulphone P-1700, manufactured by Nissan Chemical Industries, Ltd.) as a polymer, were dissolved to obtain a solution having a concentration of 7% by weight.

The weight ratio of the polysulphone to palladium metal was 8:2.

The solution of the polymer composition containing the organic metal complex thus obtained, was cast on a copper plate in a thickness of 0.4 mm by means of a doctor-knife. After removing the chloroform solvent adequately by evaporation in air, the formed film was subjected to heat treatment in an electric oven at 175° C. for 5 minutes under atmospheric air, and the resulting film was peeled off from the copper plate, whereby a one-side metallized film having a metallic luster only on the surface which was in contact with the copper plate, was obtained. The surface resistance of the surface exhibiting the metallic luster, was 1.2 $\Omega/\square$. The surface which was not in contact with the copper plate and the film in the direction of its thickness, were electrically non-conductive and showed a resistance of at least $10^{10} \Omega$cm.

From the scanning electron microscopic observation of the cross sectional structure of the one side-metallized film obtained by the above method, the film thickness was found to be 25 $\mu$m, the thickness of the metallic luster portion was 5 $\mu$m. The distribution of the metal element was determined by the scanning type electron microscope and an energy dispersion-type X-ray spectrometry, whereby it was found that palladium was localized at the portion which was in contact with the copper plate, i.e. at the portion in the depth of 5 $\mu$m from the surface exhibiting the metallic luster, and the distribution of palladium at other portions was slight. From the X-ray diffraction of the metallic luster surface of the film, sharp peaks were observed at 2.25 Å, 1.95 Å and 1.40 Å, whereby it was confirmed that the metallic luster portion was composed of a simple substance of palladium metal. From the X-ray diffraction, no palladium oxide or no palladium chloride was detected.

The metallized film obtained by this Example was dissolved in chloroform, and its composition was investigated, whereby it was found that the metallized film was composed solely of palladium metal and the polysulphone, thus indicating that there was no chemical reaction between the di-μ-chloro-bis(η-2-methylallyl)dipalladium (II) and the polysulphone and that the organic metal complex underwent thermal decomposition and released the metal.

The mechanism of the thermal decomposition of di-μ-chloro-bis(η-2-methylallyl)dipalladium (II) is not clearly understood. However, from the thermal analysis (DTA, TD) and the mass spectrometry, the following is conceivable. Namely, the DTA-TG curve of the di-μ-chloro-bis(η-2-methylallyl)dipalladium (II) complex shows a sharp weight reduction and a heat absorption peak in the vicinity of 175° C., thus indicating that it readily released palladium metal at the heat treatment temperature of this Example. The final weight reduction in the vicinity of 175° C. was 46%. This pretty well corresponds to 46% of the ligand content in the complex, thus indicating that the ligand dissipated at the time of the thermal decomposition.

The polysulphone containing the di-μ-chloro-bis(η-2methylallyl)dipalladium (II) complex used in this Example, was analyzed by a direct-feeding-type mass-spectrometry, whereby a base peak was observed at m/e 55 and M+ was observed at m/e 90. The intensity ratio of m/e 90 to 92 was 3:1. Namely, it is considered that chlorine and the 2-methylallyl group as ligands of the complex dissipated in the form of 2-methylallyl chloride from the film during the thermal treatment.

Thus, in the metallized film obtained by this Example, the palladium metal is localized at the film surface, and accordingly the metallized film has excellent flexibility and strength. Further, the metal layer on the surface is integral with the polymer, and it was not peeled even when subjected to a peeling test by means of an adhesive tape and no metal fragments fell off even when subjected to a rubbing test by mean of cotton cloth. No change was observed in the conductivity after these tests.

EXAMPLES 2, 3 and 4

Three chloroform solutions containing 7% by weight of a mixture of polysulphone polymer with di-μ-chloro-bis (η-2-methylallyl)dipalladium (II) in weight ratios of the polysulphone to palladium of 90:10, 95:5 and 97:3, respectively, were prepared, and one-side metallized films having different metal contents were prepared in accordance with the method of Example 1.

The lower the metal content in the polymer, the higher the surface resistance and transparency. The surface resistance of the metallized films of these Examples are shown in Table 1.

TABLE 1

| Examples | Surface resistance (Ω/□) |
|---|---|
| 2 | 3.5 |
| 3 | 8.0 |
| 4 | 35 |

EXAMPLE 5

A chloroform solution containing 7% by weight of a mixture of a polysulphone polymer with di-μ-chloro-bis (η-2-methylallyl)dipalladium (II) in a weight ratio of the polysulphone to the palladium metal of 99:1, was prepared, and a metallized film was prepared in accordance with the method of Example 1.

The metallized film obtained by this Example exhibited metallic luster on its surface, and the surface resistance was $10^7$ Ω/□. The surface had a nature to reflect infrared rays and the permeability of visible rays was 60%.

EXAMPLE 6

In 66.4 g of chloroform, 2.31 g of di-μ-chloro-bis (η-2-methylallyl)dipalladium (II) and 5 g of polycarbonate (Iupilon S-2000, manufactured by Mitsubishi Gas Chemical Co., Inc.) were dissolved to obtain a solution of a polymer composition having a concentration of 7% by weight.

The weight ratio of the polycarbonate polymer to the palladium metal was 8:2.

The solution thus prepared was cast on a glass base plate to form a film, followed by heat treatment, in accordance with the method of Example 1, whereby a metallized film of the polycarbonate was obtained.

The surface resistance of the metallized surface was 3.7 Ω/□.

EXAMPLE 7

A mixture of an addition-type polyimide (Kerimid 601, manufactured by Rhone-Poulenc S.A.) as a polymer with di-μ-chloro-bis(η-2-methylallyl)dipalladium (II) as an organic metal complex, was dissolved in dimethylformamide in an weight ratio of the polymer to the palladium metal of 90:10 to obtain a solution having a concentration of 30% by weight.

The solution was cast on a glass base plate in accordance with the method of Example 1, followed by drying at 100° C. for 60 minutes and heat treatment at 175° C. for 5 minutes, whereby a film metallized only on the surface which was in contact with the base plate was obained.

The surface resistance of the metallized surface was 8 Ω/□.

EXAMPLE 8

In 66.4 g of chloroform, 5.43 g of tetrakis(triphenyl phosphine)palladium (O) as an organic metal complex and 5 g of polysulphone as a polymer, were dissolved to obtain a solution having a concentration of 7% by weight.

The weight ratio of the polysulphone to the palladium metal was 9:1.

This solution was filmed in accordance with the method of Example 1, followed by heat treatment at 250° C. for 10 minutes, whereby a metallized film was obtained. The surface resistance of the metallized film surface was 20 Ω/□.

In the operation of this Example, the preparation of the polymer solution containing the tetrakis(triphenyl phosphine)palladium (O) complex and the casting of the polymer solution on the glass plate for filming, were conducted under a nitrogen atmosphere, since the complex was unstable to oxygen.

EXAMPLE 9

In 4.65 g of chloroform, 66 mg of di-μ-chloro-tetracarbonyldirhodium (I) as an organic metal complex and 350 mg of polysulphone as a polymer, were dissolved to obtain a solution having a concentration of 7% by weight.

The weight ratio of the polymer to the rhodium metal in the solution was 9:1.

The solution thus prepared was cast on a glass plate in accordance with the method of Example 1, followed by drying in air and heat treatment at 150° C. for 5 minutes, whereby a film metallized only on the surface which was in contact with the glass plate, was obtained. The surface resistance of the metallized surface was 90 $\Omega/\square$.

EXAMPLE 10

A chloroform solution containing 7% by weight of a mixture of polysulphone with di-$\mu$-chloro-bis($\eta$-2-methylallyl)dipalladium (II) in a weight ratio of the polysulphone to the palladium metal of 80:20, was prepared and cast on a glass plate to obtain a film in accordance with the method of Example 1.

The film containing the metal complex was peeled from the glass plate and sandwiched by a pair of copper plates, followed by heat pressing treatment at 160° C. under a pressure of 10 kg/cm$^2$ for 5 minutes, whereby a film having a thickness of 20 $\mu$m and metallized on both surfaces, was obtained.

The both surfaces of the film thus obtained showed a resistance of 10 $\Omega/\square$, and no conductivity was observed in the direction of the thickness.

EXAMPLE 11

Di-$\mu$-chloro-bis($\eta$-2-methylallyl)dipalladium (II) as an organic metal complex and polysulphone as a polymer were dissolved in chloroform in a weight ratio of the polymer to the palladium metal of 9:1, to obtain a chloroform solution having a concentration of 7% by weight.

The solution was coated on polyethyleneterephthalate plate and dried in air in the same manner as in Exmaple 1, and a copper plate was intimately placed on the upper surface of the polymer film containing the organic metal complex thus obtained, followed by heat pressing treatment at 160° C. under a pressure of 10 kg/cm$^2$ for 5 minutes, whereby a film metallized and being electrically conductive only on the surface which was in contact with the copper plate, was obtained.

The surface resistance of the metallized surface was 4.0 $\Omega/\square$, and no conductivity in the direction of the thickness was observed.

EXAMPLE 12

Di-$\mu$-chloro-bis($\eta$-2-methylallyl)dipalladium (II) as an organic metal complex and polysulphone as a polymer, were dissolved in chloroform in a weight ratio of the polymer to the palladium metal of 9:1 to obtain a chloroform solution having a concentration of 7% by weight.

The solution was coated on a polyethyleneterephthalate plate and dried in air in the same manner as in Example 1, and then another polyethyleneterephthalate plate which was preliminarily heat-treated at a temperature of 180° C. for 5 minutes after an application of a chloroform solution containing 1% by weight of the complex, was intimately placed on the upper surface of the polymer film containing the organic metal complex so that the pre-treated surface of the polyethyleneterephthalate plate was in contact with the upper surface of the polymer film, followed by heat pressure treatment at 180° C. under a pressure of 10 kg/cm$^2$ for 5 minutes, whereby a film metallized and being electrically conductive only on the surface which was incontact with the pre-treated polyethyleneterephthalate plate, was obtained.

The surface resistance of the metallized surface of the film thus obtained was 5 $\Omega/\square$.

EXAMPLE 13

Di-$\mu$-chloro-bis($\eta$-2-methylallyl)dipalladium (II) as an organic metal complex and polysulphone as a polymer were dissolved in chloroform in a weight ratio of the polymer to the palladium metal of 9:1 to obtain a chloroform solution having a concentration of 7% by weight.

The solution was cast on a polytetrafluoroethylene plate and dried in air in the same manner as in Example 1, and then a copper plate was intimately placed on the upper surface of the polymer film containing the organic metal complex, followed by heat pressure treatment at 160° C. under a pressure of 10 kg/cm$^2$ for 5 minutes, whereby a film metallized and being electrically conductive only on the surface which was in contact with the copper plate, was obtained.

The surface resistance of the metallized surface was 4 $\Omega/\square$, and no conductivity was observed in the direction of the thickness.

FILMS WITH METAL LAYER PATTERNS

EXAMPLE 14

In 45 g of chloroform, 0.0935 g of di-$\mu$-chloro-bis($\eta$-2-methylallyl)dipalladium (II) complex as an organic metal complex and 5 g of polysulphone were dissolved to obtain a polymer solution having a concentration of 10% by weight. The solution of the polymer composition containing the di-$\mu$-chloro-bis($\eta$-2-methylallyl)-dipalladium (II) complex, was cast on a polyethyleneterephthalate plate in a thickness of 0.4 mm by means of a doctor-knife, and after evaporating the chloroform solvent in air, dried at 60° C. for 2 hours, whereby a polymer film having a thickness of 35 $\mu$m and containing the di-$\mu$-chloro-bis($\eta$-methylallyl)dipalladium (II) complex, was obtained.

The polymer film was overlaid on a copper plate covered with a polyethyleneterephthalate film having a thickness of 15 $\mu$m with a zig-zag pattern punched out with a width of 1 mm, and subjected to heat pressure treatment at 160° C. under a pressure of 10 kg/cm$^2$ for 5 minutes, whereby a film having a palladium metal layer formed in the zig-zag pattern with a width of 1 mm on the surface which was in contact with the copper plate, was obtained.

The metal layer portion of the film with the palladium metal layer thus obtained, had a resistance of 2.6 $\Omega/\square$, and no conductivity and a resistance of at least $10^{10} \Omega$ cm were observed at the portion other than the metal layer and in the direction of the thickness.

In the film with the palladium metal layer pattern thus obtained, the metal layer is integral with the polymer, and the metal layer was not peeled by a peeling test by means of an adhesive tape or did not fall off by a rubbing test by means of cotton cloth. No change in the conductivity was observed after these tests.

EXAMPLE 15

In 45 g of chloroform, 0.0951 g of a di-$\mu$-chlorotetracarbonyl dirhodium (I) complex as an organic metal complex and 5 g of polysulphone as a polymer, were dissolved to obtain a polymer solution having a concentration of 10% by weight, and a polymer film containing the di-μ-chloro-tetracarbonyl dirhodium (I) complex was obtained in the same manner as in Example 14.

Further, a film with a rhodium metal-layer pattern was obtained by a method in accordance with Example 14.

The metal layer portion of the film with the rhodium metal layer pattern thus obtained showed a resistance of 3.7 $\Omega/\square$, and no conductivity and a resistance of at least $10^{10} \Omega cm$ were observed at the portion other than the metal layer pattern and in the direction of the thickness.

EXAMPLES 16, 17 and 18

As an organic metal complex, 0.0874 g of a di-μ-chloro-bis(1,5-cyclooctadiene)diiridium (II) complex, 0.327 g of a di-chloro-bis(triphenylphosphine)palladium (II) complex or 0.313 g of a di-chloro-bis(triethylphosphine) nickel (II) complex, was mixed in 5 g of polysulphone and 45 g of chloroform, and dissolved to obtain a solution of each polymer composition.

From the solutions of the respective polymer compositions containing the above-mentioned different organic metal complexes, polymer films containing the organic metal complexes were prepared in accordance with the method of Example 14, and then subjected to heat-pressure treatment at 180° C. under a pressure of 10 kg/cm² for 5 minutes, whereby films having a zig-zag metal layer pattern with a width of 1 mm were obtained, i.e. a film with an iridium metal layer pattern, a film with a palladium metal layer pattern and a film with a nickel metal layer pattern.

The film with the nickel metal layer pattern showed magnetism.

EXAMPLE 19

The polymer film containing the di-μ-chloro-bis(η-2-methylallyl)dipalladium (II) complex obtained in Example 14 was overlaid on a copper plate coated with an acrylic paint except for a zig-zag pattern portion with a width of 1 mm, and subjected to heat pressure treatment at 160° C. under a pressure of 10 kg/cm² for 5 minutes, whereby a film with a palladium metal layer pattern wherein the palladium metal precipitated in the zig-zag pattern with a width of 1 mm, was obtained.

EXAMPLE 20

On a polyethyleneterephthalate plate, a zig-zag pattern with a width of 2 mm was drawn with a chloroform solution containing 1% by weight of a di-μ-chloro-bis(η-2-methylallyl)dipalladium (II) complex, followed by heat treatment at 180° C. for 5 minutes to obtain a pattern-forming board.

Then, a 10 wt. % solution of a polymer composition prepared from 0.0935 g of a di-μ-chloro-bis(η-2-methylallyl)dipalladium (II) complex, 5 g of polysulphone and 45 g of chloroform, was cast on the above-mentioned pattern-forming board in a thickness of 0.4 mm by means of a doctor-knife.

After removing the chloroform solvent by evaporation in air, the formed film was subjected to heat treatment in an electric oven at 175° C. for 5 minutes under atmospheric air, and the resulting film was peeled off from the pattern-forming polyethyleneterephthalate board, whereby a film with a palladium metal layer pattern wherein the palladium metal precipitated in a zig-zag pattern with a width of 2 mm, was obtained.

EXAMPLE 21

A copper clad glass reinforced epoxy laminated board was subjected to etching treatment to remove copper except for four-linear patterns having a length of 30 mm and a width of 3 mm, 2 mm, 1 mm and 0.1 mm, respectively, and thereby to obtain a pattern-forming board.

The polymer film containing the di-μ-chloro-bis(η-2-methylallyl)dipalldium (II) complex prepared in Example 14, was overlaid on the above-mentioned pattern-forming board, and subjected to heat pressure treatment at 160° C. under a pressure of 10 kg/cm² for 5 minutes, whereby a film with a palladium metal layer pattern wherein the palladium metal precipitated in four-linear patterns having a length of 30 mm and a width of 3 mm, 2 mm, 1 mm and 0.1 mm, respectively, on the film surface which was in contact with the pattern-forming board, was obtained.

EXAMPLE 22

A polyvinyl chloride paste sol was prepared by mixing 100 g of a polyvinyl chloride paste (Zeon 121, manufactured by Nippon Zeon Co., Ltd.) and 65 g of a dioctylphthalate plasticizer.

To 100 g of the above polyvinyl chloride paste sol, 0.926 g of a di-μ-chloro-bis(η-2-methylallyl)dipalladium (II) complex dissolved in a small amount of chloroform, was added and thoroughly stirred and mixed. Then, the mixture was subjected to degassing under reduced pressure at 40° C. and chloroform was removed.

The polyvinyl chloride paste sol containing the di-μ-chloro-bis(η-2-methylallyl)dipalladium (II) complex thus obtained, was cast on a copper plate coated with a writing oil ink except for a zig-zag pattern with a width of 1 mm, in a thickness of 0.4 mm by means of a doctor-knife.

The film thus formed on the copper plate was heated at 180° C. for 5 minutes in atmospheric air, and then peeled off from the copper plate, whereby a film with a palladium metal layer pattern wherein the palladium metal precipitated in a zig-zag pattern with a width of 1 mm, was obtained.

EXAMPLE 23

In 45 g of chloroform, 0.487 g of a di-μ-chloro-bis(η-2-methylallyl)dipalladium (II) complex and 5 g of polysulphone, were dissolved to obtain a solution of a polymer composition containing the di-μ-chloro-bis(η-2-methylallyl)dipalladium (II) complex.

The solution of the polymer composition was coated on a polyethyleneterephthalate plate in a thickness of 0.1 mm by means of a doctor-knife and then dried in air, and a copper plate covered with a polyethyleneterephthalate film having a thickness of 15 μm with a zig-zag pattern punched out with a width of 1 mm, was overlaid thereon, followed by heat pressure treatment at 160° C. under a pressure of 10 kg/cm² for 5 minutes, whereby a film with a palladium metal layer pattern wherein the palladium metal precipitated in a zig-zag pattern with a width of 1 mm on the film of the polymer composition containing the di-μ-chloro-bis(η-2-methylallyl)dipalldium (II) complex, was obtained.

EXAMPLE 24

The polymer film containing the di-μ-chloro-bis (η-2-methylallyl)dipalladium (II) complex obtained in Example 14 was sandwiched between a pair of copper plates each covered with a polyethyleneterephthalate film having a thickness of 15 mm with a zig-zag pattern punched out with a width of 1 mm, and subjected to heat pressure treatment at 160° C. under a pressure of 10 kg/cm$^2$ for 5 minutes, whereby a film with a palladium metal layer pattern wherein the palladium metal precipitated on each surface of the polymer film containing the di-$\mu$-chloro-bis ($\eta$-2-methylallyl)dipalldium (II) complex, was obtained.

The metal layer portions on both sides of the film thus obtained showed a resistance of 10 $\Omega/\square$, and no conductivity was observed at other portions than the metal layer patterns and in the direction of the thickness of the film.

PRESSURE-SENSITIVELY CONDUCTIVE FILMS

EXAMPLE 25

A polyvinyl chloride paste sol was prepared by mixing 100 parts by weight of a polyvinyl chloride paste with 65 parts by weight of a dioctylphthalate plasticizer.

To 100 parts by weight of the polyvinyl chloride paste sol, 0.926 part of a di-$\mu$-chloro-bis($\eta$-2-methylallyl) dipalladium (II) complex dissolved in a small amount of chloroform was added and thoroughly stirred and mixed. Then, the mixture was subjected to degassing under reduced pressure at 40° C. and chloroform was removed.

The polyvinyl chloride paste sol containing the di-$\mu$-chloro-bis($\eta$-2-methylallyl)dipalladium (II) complex thus obtained, was cast on a copper plate having a thickness of 100 $\mu$m as a metallizing board, in a thickness of 400 $\mu$m by means of a doctor-knife.

The film thus formed on the copper plate was heated at 180° C. for 5 minutes in atmospheric air, and then peeled from the copper plate, whereby a pressure-sensitively conductive polyvinyl chloride film having a thickness of 290 $\mu$m and metallized on one surface, was obtained.

A sample having a length of 50 mm and a width of 8 mm was taken from the film, and a pair of copper wires having a diameter of 0.2 mm were attached to the center portion of the sample by means of an electroconductive silver-type adhesive (Eccobond Solder 56C, manufactured by Emerson & Cuming Japan K.K.) with a distance of 20 mm in the longitudinal direction of the sample to form fixed electrodes extending in parallel with each other and perpendicular to the film surface. The sample provided with the electrodes was mounted on a tensile test machine (Tensilon UTM-5, manufactured by Toyo Baldwin Co., Ltd.), and the electrodes were connected to an electric resistance meter (LCR meter AG-4311, manufactured by Ando Electric Co., Ltd.) by means of lead wires.

The sample was stretched to a predetermined extent, and the length between the electrodes at that time was measured and divided by the initial length, whereby the value obtained by the division was taken as a stretching rate. Further, the electric resistance at that time was measured.

The film stretching was stopped at a stretching rate of 8%, and while permitting the stretched film to return to the initial state, the stretching rates and the corresponding electric resistance values were measured, whereby the results as shown in FIG. 1 were obtained.

The measurements were repeated 1000 times by repeating the stretching and releasing of the film, whereby the same electric resistance values were obtained at the same stretching rates.

EXAMPLE 26

To 100 parts by weight of the polyvinyl chloride paste sol prepared in Example 25, 1.85 parts by weight of a di-$\mu$-chloro-bis($\eta$-2-methylallyl)dipalladium (II) complex dissolved in a small amount of chloroform, was added and thoroughly stirred and mixed, and then the mixture was treated in the same manner as in Example 25 to obtain a polyvinyl chloride paste sol containing the di-$\mu$-chloro-bis($\eta$-2-methylallyl)dipalladium (II) complex, which was then formed into a pressure-sensitively conductive polyvinylchloride film having a thickness of 300 $\mu$m and metallized on one surface, in the same manner as in Example 25.

Figure 2:
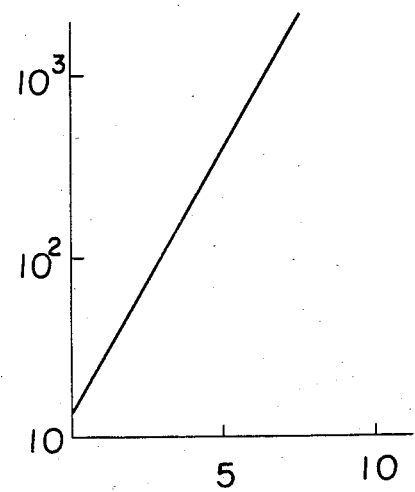

Then, the relation between the stretchig rate and the electric resistance value was obtained in the same manner as in Example 25, whereby the results as shown in FIG. 2 were obtained.

The measurements were repeated 1000 times by repeating the stretching and releasing of the film, whereby the same electric resistance values were obtained at the same stretching rates.

EXAMPLES 27, 28, 29 and 30

Pressure-sensitively conductive polyvinyl chloride films metallized on one surface, were prepared in the same manner as in Example 25 except that the polyvinyl chloride paste sol prepared in Example 25 was combined with a di-$\mu$-chloro-tetracarbonyl dirhodium (I) complex, a di-chloro-bis(1,5-cyclooctadiene)diiridium (I) complex, a di-chloro-bis(triphenylphosphine)palladium (II) complex, and di-chloro-bis(triethylphosphine)nickel (II) complex, respectively, dissolved in a small amount of chloroform. The working conditions and the results are shown in Table 2.

Figure 3:
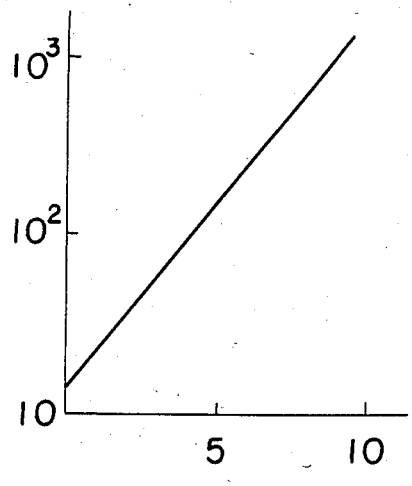
Figure 4:
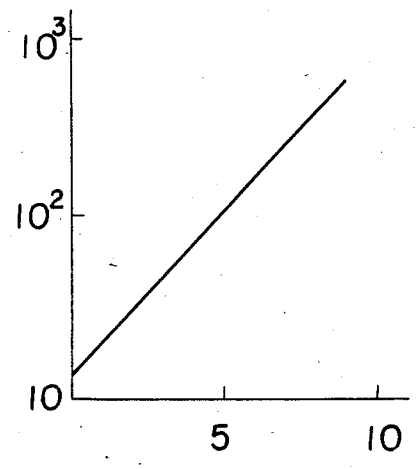
Figure 5:
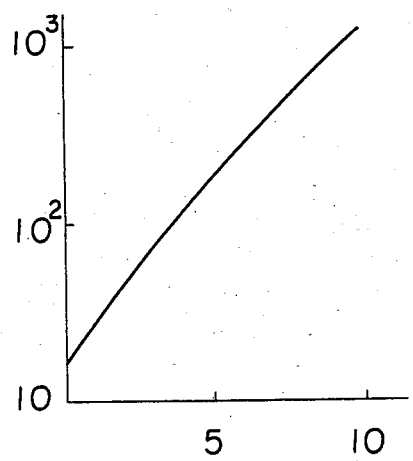
Figure 6:
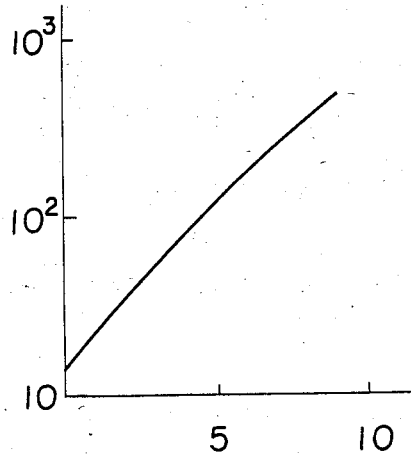

Then, the relations between the stretching rates and the electric resistance values of the respective films were determined in the same manner as in Example 25, whereby the results as shown in FIG. 3 (Example 27), FIG. 4 (Example 28), FIG. 5 (Example 29) and FIG. 6 (Example 30), were obained.

EXAMPLE 31

The pressure-sensitively conductive polyvinyl chloride film metallized on one surface, prepared in Example 25, was mounted on a tensile test machine, and subjected to a durability test by repeating a repeating cycle of 0.5 Hz at a stretching rate of 10% for 500,000 times.

The electric resistance value of the film at the stretching rate of 0% prior to the test was 23$\Omega$, and the electric resistance value of the film at the stretching rate of 0% after the repeating test of 500,000 times, was 28$\Omega$. This indicates that no falling of the formed aggregation of fine metal particles from the polyvinylchloride film or no breakage of the aggregation of the fine metal particles took place by the repeated stretching operations.

Further, this has been confirmed also from the results of the scanning-type electron microscopic observation of the metallized surface of the polyvinylchloride film prior to and after the repeated test.

EXAMPLE 32

To 100 parts by weight of a silicone resin (SH 9550, manufactured by Tore Silicone Co., Ltd.), 10 parts by weight of a hardening agent (a catalyst for SH 9550, manufactured by Tore Silicone Co., Ltd.) was added and thoroughly mixed. To this mixture, 0.962 part by weight of a di-μ-chloro-bis(η-2-methylallyl)dipalladium (II) complex dissolved in a small amount of chloroform was added and thoroughly stirred and mixed.

Then, the mixture was cast on a copper plate in the same manner as in Example 25, dried at room temperature for 1 hour in air, then dried at 40° C. for 2 hours under reduced pressure and heat-treated at 180° C. for 5 minutes in atmospheric air, and the film thereby formed was peeled off from the copper plate, whereby a pressure-sensitively conductive silicone film having a thickness of 250 μm and metallized on one surface was obtained.

In the same manner as in Example 25, the film was mounted on a tensile test machine and subjected to a durability test by repeating a repeating cycle of 0.4 Hz at a stretching rate of 15% for 500,000 times.

The electric resistance value of the film at a stretching rate of 0% prior to the test was 18Ω, and the electric resistance value of the film at a stretching rate of 0% after the test of the repeating operation of 500,000 times, was 22Ω.

No breakage or no falling off from the silicone film, of the aggregation of fine metal particles was observed during the repeating test. This has been confirmed also from the scanning-type electron microscopic observations of the metallized surface of the silicone film prior to and after the repeating test.

although they are rather wide, thus indicating that the palladium metal precipitated in the film.

Further, the above-mentioned metal complex itself and the slightly yellow transparent film obained after drying in air were measured at 180° C. by a direct-feeding method by means of an electron shock mass spectrometry apparatus, whereby peaks were observed at a mass number of 90, 92 and 55. This indicates that the above-mentioned metal complex underwent thermal decomposition to form palladium metal and 2-methylallyl chloride. Accordingly, it is considered that 2-methylallyl chloride dissipates from the film during the thermal decomposition, and only the formed palladium metal remains in the film.

Further, the obtained black film was dissolved in chloroform, diluted and observed by a transmission-type electron microscope, whereby particles having a size of from 20 to 100 μm were observed. (FIG. 7 shows a transmission-type electron microscopic photograph of the palladium metal particles in 50,000 magnifications.)

EXAMPLE 34

A 10 wt. % chloroform solution of a polymer composition with a weight ratio of the palladium metal to polycarbonate of 1:9, was prepared in accordance with Example 33 by using di-μ-chloro-bis(η-2-methylallyl) dipalladium (II) as an organic metal complex and polycarbonate as a polymer. By using this solution, a film was prepared by a casting method in accordance with

TABLE 2

| Examples | Organic metal complex | Amount (parts by weight) | Metallizing board | Heating conditions | Thickness of the metallized film |
| --- | --- | --- | --- | --- | --- |
| 27 | Di-μ-chloro-tetra-carbonyl dirhodium (I) | 1.88 | Copper plate | 180° C., 5 min. | 290μ |
| 28 | Di-chloro-bis(1,5-cyclooctadiene)-diiridium (I) | 1.75 | Copper plate | 180° C., 5 min. | 305μ |
| 29 | Di-chloro-bis(tri-phenylphosphine)-palladium (II) | 6.67 | Copper plate | 180° C., 5 min. | 290μ |
| 30 | Di-chloro-bis(tri-ethylphosphine)-nickel (II) | 4.26 | Tin plate | 180° C., 5 min. | 300μ |

POLYMERS WITH FINE METAL PARTICLES DISPERSED THEREIN

EXAMPLE 33

Di-μ-chloro-bis(η-2-methylallyl)dipalladium (II) was used as an organic metal complex, and polysulphone was used as a polymer. The thermal decomposition temperature of the organic metal complex was from 165° to 170° C., and the glass transition temperature of the polysulphone was 190° C.

In 21.7 g of chloroform, 411 mg of di-μ-chloro-bis (η-2-methylallyl)dipalladium (II) and 2.0 g of polysulphone were dissolved to obtain a solution wherein the weight ratio of the palladium metal to the polysulphone was 1:9.

This solution was cast on a glass plate by means of a doctor-knife of 0.4 mm and then dried in air to evaporate chloroform. A slightly yellow transparent film thus formed was peeled off from the glass plate, and left in a drier at 180° C. for 5 minutes, whereby a film black in its entirety was obtained. This film has a thickness of 20 μm and adequately flexible. This film was examined by a X-ray diffraction meter, whereby peaks were observed in the vicinity of 2.25 Å, 1.95 Å and 1.40 Å

Example 33, and left in a drier at 180° C. for 5 minutes, whereby a flexible film black in its entirety was obtained.

EXAMPLE 35

A 10 wt. % chloroform solution with a weight ratio of rhodium metal to polysulphone of 5:95, was prepared by using di-μ-chloro-tetracarbonyl dirhodium (O) as an organic metal complex and polysulphone as a polymer. By using this solution, a film was prepared by a casting method in accordance with Example 33, and subjected to heat treatment at 170° C. for 5 minutes, whereby a flexible black film was obtained.

EXAMPLE 36

To 12 g of a melamine resin molding material (Sander-MM, white, manufactured by Matsushita Electric Works, Ltd.), 15 ml of a chloroform solution containing 222 mg of di-μ-chloro-bis(η-2-methylallyl)dipalladium (II), was added. Chloroform was distilled off under stirring at room temperature, and a tablet was prepared from 11.5 g of the material. This tablet was subjected to a compression molding at a mold temperature of 175° C. under a pressure of 150 kg/cm² for 3 minutes, whereby a entirely black disc having a thickness of 2 mm and a diameter of 70 mm was obtained.

EXAMPLE 37

To 15 g of an epoxy resin molding material (Achmelite #100, green, manufactured by the Nippon Synthetic Chemical Industry Co., Ltd.), 15 ml of a chloroform solution containing 277 mg of di-$\mu$-chloro-bis($\eta$-2-methylallyl)dipalladium (II), was added. Chloroform was distilled off under stirring at room temperature, and a tablet was prepared from 14 g of the material. The tablet was subjected to compression molding at a mold temperature of 175° C. under a pressure of 150 kg/cm$^2$ for 3 minutes, whereby an entirely, black disc having a thickness of 2 mm and a diameter of 70 mm was obtained.

HIGHLY DIELECTRIC POLYMERS

EXAMPLE 38

Ethyl acetate was added to polymethylmethacrylate (degree of polymerization: 7000-7500) to obtain an ethyl acetate solution having a concentration of 25% by weight. To 100 g of this solution, 2.44 g of a di-$\mu$-chloro-bis($\eta$-2-methylallyl)dipalladium (II) complex having a metal content of 54% by weight, was dissolved to obtain a uniform solution. Then, ethyl acetate was removed to obtain polymethylmethacrylate containing the metal complex. By means of a hydraulic molding machine, this material was pre-heated at 190° C. for 5 minutes under no pressure, then molded under a pressure of 30 kg/cm$^2$ for 2 minutes and further cold-pressed under 30 kg/cm$^2$ for 5 minutes, whereby a black plate having a thickness of 3 mm was obained. The di-$\mu$-chloro-bis($\eta$-2-methylallyl)dipalladium (II) complex contained in the polymethylmethacrylate, was completely decomposed during the pre-heating to precipitate the palladium metal, and the content of the palladium metal was 5% by volume.

The dielectric characteristics ($\epsilon$: permittivity, tan $\delta$: dielectric loss tangent), the volume resistivity and the dielectric breakdown voltage of the molded product thus obtained, were measured. The results are shown in Table 3.

EXAMPLE 39

Xylene was added to polymethylmethacrylate (degree of polymerization: 7000-7500) to obtain a xylene solution having a concentration of 5% by weight. To 100 g of this solution, 14.5 g of an octacarbonyl dicobalt (O) complex having a metal content of 34.5% by weight was dissolved in a reactor equipped with a reflux condenser to obtain a uniform solution, which was then refluxed under stirring and heating. As the cobalt complex decomposed, the reaction solution turned black due to the precipitation of cobalt metal, and the generation of carbon monoxide gas was observed. Upon termination of the generation of carbon monoxide gas, xylene was removed to obtain black cobalt-dispersed polymethylmethacrylate.

The cobalt-dispersed polymethylmethacrylate thus obtained was pre-heated at 190° C. for 3 minutes under no pressure, then molded under a pressure of 30 kg/cm$^2$ and further cold-pressed under pressure of 30 kg/cm$^2$ for 5 minutes by means of a hydraulic molding machine, whereby a black plate having a thickness of 3 mm was obtained.

The cobalt content of this molded product was 12% by volume.

The dielectric characteristics ($\epsilon$: permittivity, tan $\delta$: dielectric loss tangent), the volume resistivity and the dielectric breakdown voltage of the molded product thus obtained, were measured. The results are shown in Table 3.

EXAMPLE 40:

A plate-like molded product of cobalt-dispersed polymethylmethacrylate having a cobalt content of 30% by volume was prepared in the same manner as in Example 39 from 100 g of a 5 wt. % xylene solution of polymethylmethacrylate (degree of polymerization: 7000-7500) and 46.1 g of an octacarbonyl dicobalt (O) complex.

The dielectric characteristics ($\epsilon$: permittivity, tan $\delta$: dielectric loss tangent), the volume resistivity and the dielectric breakdown voltage of the molded product thus obtained, were measured. The results are shown in Table 3.

TABLE 3

| | | Dielectric characteristics | | | Dielectric breakdown voltage V/mil | Volume resistivity $\Omega$ cm |
|---|---|---|---|---|---|---|
| | | 100 Hz | 10 KHz | 100 KHz | | |
| Example 38 | $\epsilon$ | 12 | 11.5 | 11.5 | 410 | $10^{14}$ |
| | tan $\delta$ | 0.019 | 0.020 | 0.025 | | |
| Example 39 | $\epsilon$ | 16.2 | 15.5 | 15.1 | 390 | $10^{14}$ |
| | tan $\delta$ | 0.021 | 0.023 | 0.031 | | |
| Example 40 | $\epsilon$ | 31 | 29.6 | 29 | 380 | $4 \times 10^{13}$ |
| | tan $\delta$ | 0.025 | 0.027 | 0.034 | | |

Notes
1. $\epsilon$: permittivity, tan $\delta$: dielectric loss tangent
2. The dielectric characteristics were measured by means of LCR meter AG-4311 manufactured by Ando Electric Co., Ltd. and the accompanying solid electrodes SE-70 Model.
3. The dielectric breakdown voltage was measured by a short time method in accordance with ASTM-D149.
4. The volume resistivity was measured in accordance with JIS K-6911.

What is claimed as new and desired to be secured by Letters Patent of the United States is:

1. A method for producing a metallized polymer, which comprises:
   (a) contacting a polymer film comprising a polymer and an organic metal complex wherein the weight ratio of the polymer to the metal of said organic metal complex ranges from about 99.9:0.1 to 80:20, with a metallizing board, wherein said metallizing board has a heat-treated coating thereon comprising said organic metal complex;
   (b) forming a metal layer on the surface of said film from the liberated metal from said organic metal complex by heating the polymer film and coated metallizing board of step (a); and
   (c) recovering a polymer film with a metallized surface thereon.

2. A polymer film with a metallized surface, prepared by the method according to Claim 1.

3. A polymer film having a metal layer of a predetermined pattern on its surface, prepared by the method according to Claim 1.

4. A polymer with fine metal particles uniformly dispersed therein, prepared by the method according to Claim 1.

5. The polymer according to Claim 4, which is a highly dielectric polymer.

6. A pressure-sensitively conductive rubber-like polymer film with a metallized surface, prepared by the method according to Claim 1.

7. The method of claim 1 wherein the weight ratio of the polymer to the metal of the organic metal complex is within a range of from 99.99:0.01 to 1:99.

8. The method of claim 1 wherein the central metal of the organic metal complex is at least one metal selected from the group consisting of metals of Groups IV-A, V-A, VII-A, VIII and I-B of the Periodic Law Table.

9. The method of claim 1 wherein the central metal is at least one metal selected from the group consisting of titanium, zirconium, vanadium, chromium, molybdenum. tungsten, manganese, iron, cobalt, nickel, ruthenium; rhodium, iridium, palladium, osmium, platinum copper, silver and gold.

10. The method of claim 1 wherein the ligand of the organic metal complex is at least one ligand selected from the group consisting of a tertiary phosphine, a tertiary phosphite, carbon monoxide, an aliphatic or alicyclic olefin, a conjugated olefin, an aryl compound, a heterocyclic compound, an organic cyano compound, an organic isonitrile compound, an organic mercapto compound, a compound having an alkyl group, a vinyl group, an allyl group, an ethynyl group or an acyl group, halogen, oxygen, hydrogen and nitrogen.

11. The method of claim 1 wherein the ligand of the organic metal complex is at least one ligand selected from the group consisting of triphenylphosphine, tributylphosphine, triethylphosphine, triphenylphosphite, tributylphosphite, triethylphosphite, carbon monoxide, cyclooctadiene, a substituted or unsubstituted cyclopentadiene, cyclooctatetraene, butadiene, pentadiene, a substituted or unsubstituted benzene, acetonitrile, benzonitrile, a compound having a lower alkyl group or a benzyl group, ethylene, propylene, isobutylene, t-butylisonitrile, vinyl-isonitrile, benzo-isonitrile, a substituted or unsubstituted acetylene, acetylacetone, ethyl acetyl acetonate, pyridine, thiophene, quinoline, furan, 2,2'-dipyridyl, ethylenedithiol, toluene-3,4-dithiol, chlorine and bromine.

12. The method of claim 1 wherein the polymer is at least one polymer selected from the group consisting of an ionomer resin, an acrylonitrile-acrylic-styrene resin, an acrylonitrile-styrene resin, an acrylonitrile-butadiene-styrene resin, a methylmethacrylate-butadiene-styrene resin, a phenoxy resin, an ethylene-vinylchloride copolymer, an ethylene-vinylacetate copolymer, a polystyrene, a polyvinylidene chloride, a vinyl acetate, a polyethylene, a polypropylene, a polybutadiene, a polyvinylidene fluoride, a polytetrafluoroethylene, a polyacetal, a polyamide, a polyamide-imide, a polyarylate, a polyether-imide, a polyether-ether ketone, a polyethyleneterephthalate, a polybutyleneterephthalate, a polycarbonate, a polysulphone, a polyethersulphone, a polyphenylene oxide, a polyphenylene sulfide, a polymethylmethacrylate, a guanamine resin, a diallylphthalate resin, a vinyl ester resin, a phenol resin, an unsaturated polyester resin, a furan resin, a polyimide resin, a poly-p-hydroxybenzoate, a urethane resin, a melamine-formaldehyde resin, a urea-formaldehyde resin, an epoxy resin and a xylene-formaldehyde resin.

13. The method of claim 1 wherin the polymer is at least one rubber-like polymer selected from the group consisting of a styrene-butadiene rubber, a polybutadiene rubber, a polyisoprene rubber, an acrylo nitrile-butadiene rubber, a polychloroprene rubber, a butyl rubber, a urethane rubber, an acrylate rubber, a silicone rubber, a fluorinated rubber, a styrene-block copolymer, a thermoplastic elastomer polyolefin, a thermoplastic elastomer polyvinylchloride, a thermoplastic elastomer polyurethane, a thermoplastic elastomer polyester, a thermoplastic elastomer polyamide, a thermoplastic elastomer fluorinated resin and a natural rubber.

14. The method of claim 1, wherein said metallizing board is aluminum or glass.

15. The method of claim 1, wherein said metallizing board is a resin plate having a heat treated coating thereon comprising an organic metal complex.

16. The method of claim 1, wherein said metallizing board is partially coated with a resin not capable of inducing metallization.

17. The method of claim 16, wherein the surface of the recovered metallized polymer contains a pattern.

* * * * *